United States Patent [19]
Sager

[11] Patent Number: 5,404,114
[45] Date of Patent: Apr. 4, 1995

[54] METHOD AND APPARATUS FOR PROVIDING TRANSMITTER PROTECTION

[75] Inventor: Henry L. Sager, Allen, Tex.

[73] Assignee: Rockwell International Corporation, Seal Beach, Calif.

[21] Appl. No.: 264,555

[22] Filed: Jun. 23, 1994

[51] Int. Cl.⁶ .............................................. H03F 1/52
[52] U.S. Cl. ...................... 330/207 P; 330/298; 455/117
[58] Field of Search ............. 330/207 P, 298; 361/78, 361/87; 455/115, 117

[56] References Cited

U.S. PATENT DOCUMENTS

| | | | |
|---|---|---|---|
| 2,479,548 | 8/1949 | Young | 250/17 |
| 2,816,180 | 12/1957 | French | 179/171 |
| 3,449,680 | 6/1969 | Schilb et al. | 330/298 |
| 4,011,512 | 3/1977 | Drury | 325/150 |
| 4,485,349 | 11/1984 | Siegel et al. | 330/3 |
| 4,673,886 | 6/1987 | Bickley et al. | 330/298 |
| 4,802,237 | 1/1989 | Covill | 455/117 |

Primary Examiner—James B. Mullins
Attorney, Agent, or Firm—M. Lee Murrah; H. Fredrick Hamann

[57] ABSTRACT

An RF transmitter protection circuit for providing protection to a power amplifier includes circuitry for sensing the presence of an input excitation signal applied to the input of the power amplifier. Circuitry is provided for monitoring an output signal generated by the power amplifier at the output of the power amplifier and for generating a signal proportional to the output signal. Circuitry is further provided for applying the signal generated by the monitoring circuit to the input of the power amplifier in response to a loss of input signal detected by the sensor.

4 Claims, 1 Drawing Sheet

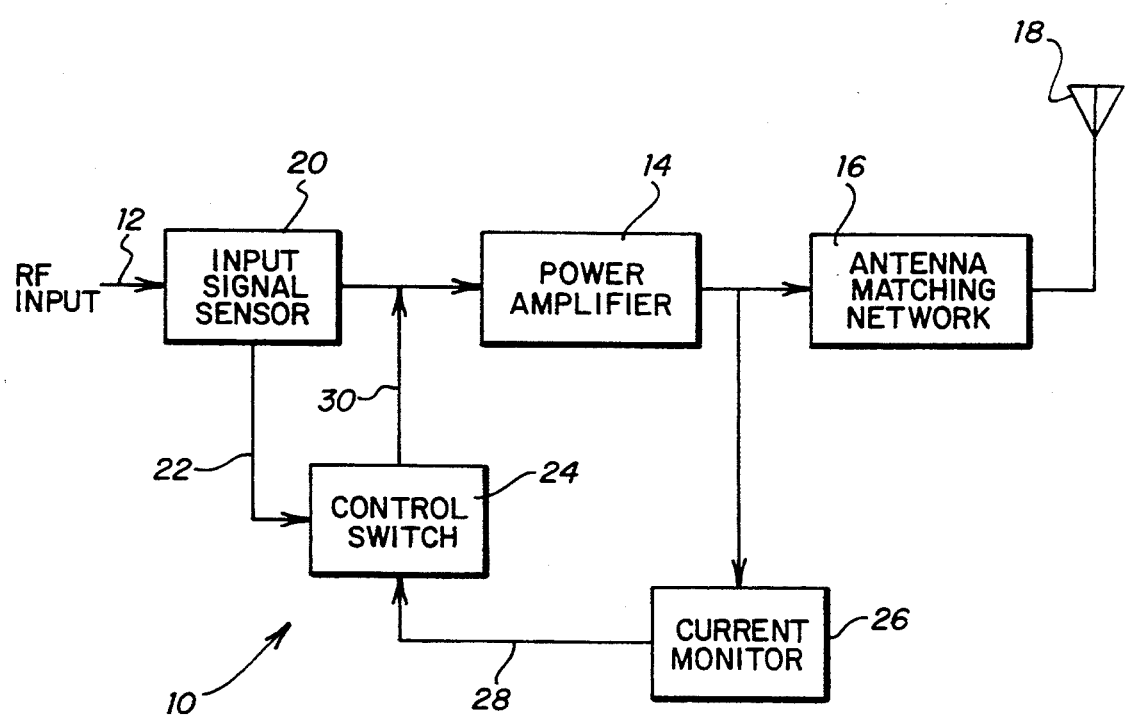

METHOD AND APPARATUS FOR PROVIDING TRANSMITTER PROTECTION

TECHNICAL FIELD OF THE INVENTION

The present invention relates to radio frequency transmitters, and more particularly to a method and apparatus for providing protection to power amplifiers utilized with such transmitters.

BACKGROUND OF THE INVENTION

A high-power transmitter with a high-Q antenna such as, for example, solid state fixed position VLF station transmitters, are susceptible to severe damage if the radio frequency (RF) input excitation to the transmitter is suddenly removed or drastically changed in frequency. As a result, the high energy stored in the high-Q antenna and the antenna impedance matching circuit is subsequently dissipated in the power amplifier output devices at a level well above the maximum rating of such power amplifiers, thereby causing massive power output device failures. This failure results from the energy stored in high-Q antennas.

A need has thus arisen for a circuit protection device for protecting power amplifiers utilized with RF transmitters in the event of a loss in RF input excitation to the transmitter.

SUMMARY OF THE INVENTION

In accordance with the present invention, an RF transmitter protection circuit for providing protection to a power amplifier is provided. The circuit includes circuitry for sensing the presence of an input excitation signal applied to the input of the power amplifier. Circuitry is provided for monitoring an output signal generated by the power amplifier at the output of the power amplifier and for generating a signal proportional to the output signal. Circuitry is further provided for applying the signal generated by the monitoring circuit to the input of the power amplifier in response to a loss of input signal detected by the sensor.

BRIEF DESCRIPTION OF THE DRAWING

For a more complete understanding of the present invention and for further advantages thereof, reference is now made to the following Description of the Preferred Embodiments taken in conjunction with the accompanying Drawing which is a block diagram of the present transmitter.

DESCRIPTION OF THE PREFERRED EMBODIMENTS

Referring to the Figure, a diagram of a transmitter 10 utilizing the present invention is illustrated. Transmitter 10 receives excitation from an RF input 12 which is applied to a power amplifier 14. The output of power amplifier 14 is applied to an antenna matching network 16 whose output is applied to an antenna 18. RF input 12 represents a generator which supplies RF signals in each of the frequency bands in which the transmitter 10 is to be operated. These RF signals are amplified by power amplifier 14.

In the event of loss of RF input 12 to power amplifier 14, or if RF input 12 falls below a minimum level, operation of amplifier 14 will terminate and present a low impedance state at its output. As a result, a large amount of RF power will be reflected back from antenna 18 through antenna matching network 16 to power amplifier 14. This high reflective power can damage power amplifier 14, and therefore the present invention provides for a method and apparatus for protecting power amplifier 14 in the event of loss or otherwise corruption of the RF excitation input 12 to transmitter 10.

Power amplifier 14 may comprise, for example, a solid state high-efficiency class D high-power amplifier. A sine wave input signal is converted to a square wave signal which is power amplified by amplifier 14. The output signal is a square wave voltage source that has a sine wave current due to the series resonant type load presented by antenna matching network 16. Antenna matching network 16 is a 90° phase shift type of network implementing a standard technique used to broadband the power applied to high-Q antennas.

In accordance with the present invention, an input signal sensor 20 is utilized for monitoring the presence or absence, or below a minimum level, of the RF input signal 12. Input signal sensor 20 may comprise, for example, a phase locked loop that is locked to the input signal 12. When the input signal 12 is removed, the loop error signal would indicate an out of lock condition. Input signal sensor 20 may also comprise, for example, a full wave rectifier. Further, sensor 20 may operate to sample the input signal 12 at multiple points of the cycle and verify that the sample point of the signal is of correct magnitude and polarity. Input signal sensor 20 responds within a fraction of a cycle to the absence of input signal 12, and provides an actuation signal via line 22 to a control switch 24. Switch 24 may comprise, for example, an analog type high speed integrated circuit switch such as, for example, a model DG301A manufactured and sold by Siliconix, Inc. of Santa Clara, Calif.

The output of power amplifier 14 is monitored by a current monitor 26 which monitors the RF current at the output of power amplifier 14. Current monitor 26 may comprise, for example, a current monitor Model No. 310 manufactured and sold by Pearson Electronics, Inc. of Palo Alto, Calif. Current monitor 26 generates a voltage output that is in phase with the current being monitored from power amplifier 14. Current monitor 26 may also comprise a current transformer in which the burden resistor is sufficiently low enough in resistance to prevent phase shift between the monitored current and the voltage output. Current monitor 26 may also comprise a Hall-effect sensor.

The voltage sample, derived from the output current of power amplifier 14, and generated by current monitor 26 is applied via signal line 28 to control switch 24. When actuated, control switch 24 provides the voltage sample derived from the output current of power amplifier 14 to the input of power amplifier 14 via signal line 30. This voltage acts as a substitute RF excitation for the RF input signal 12 in order to continually provide input to power amplifier 14 thereby preventing damage to power amplifier 14 in the event of removal of RF input signal 12. In the event of loss of RF input signal 12, control switch 24 is actuated to provide an input to power amplifier 14 which represents a voltage sample derived from power amplifier 14 output current to be used as a substitute RF input 12 for transmitter 10. After this substitution has been made, transmitter 10 may be reduced in power at a controlled rate by other transmitter 10 systems.

The present protection apparatus must operate to sense a loss of RF input signal 12 in a short period of time; for example, less than one-fourth of an RF cycle to limit the transient to a reasonable value in order to prevent the large current build-up at the output of power amplifier 14. The time allowable for sensor 20 to sense a lack of RF input 12 is dependent on the amount of energy stored in antenna 18 and how fast the current rises when RF drive power to antenna 18 is removed. Voltage is reapplied via signal line 30 to power amplifier 14 of continuous phase as that of the removed RF input signal 12 and should have a center frequency compared to the upper and lower modulation frequency even though the interruption to RF input signal 12 may have occurred at the upper or lower modulation frequency.

It therefore can be seen that the present invention provides for a method and apparatus for protecting power amplifiers of transmitters in the event of loss of excitation RF signal.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. An RF transmitter protection circuit for providing protection to a power amplifier having an input and an output, the circuit comprising:
   means for sensing the presence of an input signal applied to the input of the power amplifier;
   means for monitoring an output signal generated by the power amplifier at the output of the power amplifier and for generating a signal proportional to said output signal; and
   means for applying said signal generated by said monitoring means to the input of the power amplifier in response to a loss of input signal detected by said sensing means.

2. The circuit of claim 1 wherein said monitoring means includes:
   means for monitoring output current generated by the power amplifier and for generating a voltage in phase with said output current.

3. A method for providing protection to a power amplifier having an input and an output of an RF transmitter comprising the steps of:
   sensing the presence of an input signal applied to the input of the power amplifier;
   monitoring an output signal generated by the power amplifier at the output of the power amplifier and generating a signal proportional to the output signal; and
   applying said signal proportional to the power amplifier output signal to the input of the power amplifier in response to a loss of input signal to the power amplifier.

4. The method of claim 3 wherein the step of monitoring includes:
   monitoring output current generated by the power amplifier and generating a voltage in phase with the output current.

* * * * *